(12) United States Patent
Joshi et al.

(10) Patent No.: US 9,917,170 B2
(45) Date of Patent: Mar. 13, 2018

(54) CARBON BASED CONTACT STRUCTURE FOR SILICON CARBIDE DEVICE TECHNICAL FIELD

(71) Applicant: Infineon Technologies AG, Neubiberg (DE)

(72) Inventors: Ravi Joshi, Villach (AT); Romain Esteve, Villach (AT); Markus Kahn, Rangersdorf (AT); Gerald Unegg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/136,121

(22) Filed: Apr. 22, 2016

(65) Prior Publication Data

US 2017/0309720 A1  Oct. 26, 2017

(51) Int. Cl.
*H01L 21/28* (2006.01)
*H01L 21/44* (2006.01)
*H01L 29/45* (2006.01)
*H01L 29/16* (2006.01)
*H01L 21/04* (2006.01)
*H01L 21/265* (2006.01)
*H01L 21/324* (2006.01)

(52) U.S. Cl.
CPC .......... *H01L 29/45* (2013.01); *H01L 21/0485* (2013.01); *H01L 21/26506* (2013.01); *H01L 21/324* (2013.01); *H01L 29/1608* (2013.01)

(58) Field of Classification Search
CPC ... H01L 29/45; H01L 29/1608; H01L 21/324; H01L 21/26506; H01L 21/0485; H01L 21/02376; H01L 21/02378; H01L 21/02527; H01L 21/02529; H01L 29/1602; H01L 33/34; H01L 21/0216; H01L 21/0435; H01L 21/0495; H01L 21/28537; H01L 21/28581; Y10S 438/931
See application file for complete search history.

(56) References Cited

U.S. PATENT DOCUMENTS 6,133,120 A * 10/2000 Miyajima ............ C30B 25/00
257/E21.056
2013/0234161 A1* 9/2013 Shimizu ............ H01L 29/1608
257/77

(Continued)

FOREIGN PATENT DOCUMENTS

JP  2015153789 A  8/2015

*Primary Examiner* — Julio J Maldonado
*Assistant Examiner* — Stanetta Isaac
(74) *Attorney, Agent, or Firm* — Murphy, Bilak & Homiller, PLLC

(57) ABSTRACT

A method of forming a contact structure includes providing a silicon-carbide substrate having a highly doped silicon-carbide contact region formed in the substrate and extending to a main surface of the substrate. A carbon-based contact region is formed which is in direct contact with the highly doped silicon-carbide contact region and which extends to the main surface. A conductor is formed on the carbon-based contact region such that the carbon-based contact region is interposed between the conductor and the highly doped silicon-carbide contact region. A thermal budget for forming the carbon-based contact region is maintained below a level that induces metal silicidization of the highly doped silicon-carbide contact region.

18 Claims, 8 Drawing Sheets

(56) References Cited

U.S. PATENT DOCUMENTS

2015/0270354 A1* 9/2015 Shimizu .............. H01L 29/1608
　　　　　　　　　　　　　　　　　　　　　　257/77
2016/0056242 A1* 2/2016 Masuda .............. H01L 29/7813
　　　　　　　　　　　　　　　　　　　　　　257/77

* cited by examiner

CARBON BASED CONTACT STRUCTURE FOR SILICON CARBIDE DEVICE TECHNICAL FIELD

TECHNICAL FIELD

The instant application relates to forming contact structures for semiconductor devices, and more particularly relates to forming ohmic contact structures for silicon-carbide semiconductor devices.

BACKGROUND

As silicon is reaching its performance limit, other semiconductor materials are drawing attention as potential substrate materials for integrated circuits. 4H—SiC (silicon-carbide) materials have a high bandgap and therefore represent one promising alternative to silicon. However, 4H—SiC presents several design challenges. For example, it is difficult to form high performance ohmic contacts on 4H—SiC substrates. To date, nickel (Ni) based alloys are used to form ohmic contacts on silicon-carbide substrates. Due to the high surface stability of the 4H—SiC material, a high temperature (e.g., ≥800° C.) annealing step is required to alloy the Ni with the 4H—SiC. This high temperature can potentially degrade the quality and reliability of the gate oxide for an SiC based MOSFET. Furthermore, nickel based alloys are difficult to structure and difficult to etch. Moreover, nickel presents a cross-contamination risk with other technologies (e.g., Si technology) that are common to the fabrication tooling. Alternative methodology is needed to form an Ohmic contact for a silicon-carbide substrate without the above mentioned drawbacks.

SUMMARY

A method of forming a contact structure for a semiconductor device is disclosed. According to an embodiment, the method includes providing a silicon-carbide substrate having a highly doped silicon-carbide contact region formed in the substrate and extending to a main surface of the substrate. A carbon-based contact region is formed which is in direct contact with the highly doped silicon-carbide contact region and which extends to the main surface. A conductor is formed on the carbon-based contact region such that the carbon-based contact region is interposed between the conductor and the highly doped silicon-carbide contact region. A thermal budget for forming the carbon-based contact region is maintained below a level that induces silicidization of the highly doped silicon-carbide contact region.

According to another embodiment, the method includes providing a silicon-carbide substrate having a highly doped silicon-carbide contact region formed in the substrate and extending to a main surface of the substrate. A carbon-based contact region is formed which is in direct contact with the highly doped silicon-carbide contact region and which extends to the main surface. A conductor is formed on the carbon-based contact region such that the carbon-based contact region is interposed between the conductor and the highly doped silicon-carbide contact region. The carbon-based contact region is formed before the conductor. The main surface extends along a single plane.

A contact structure for silicon-carbide semiconductor device is disclosed. According to an embodiment, the contact structure includes a silicon-carbide substrate having a highly doped silicon-carbide contact region formed in the substrate and extending to a main surface of the substrate. A carbon-based contact region is disposed above the main surface and directly adjoins the highly doped silicon-carbide contact region. A conductor directly adjoins the carbon-based contact region such that the carbon-based contact region is interposed between the conductor and the highly doped silicon-carbide contact region. An interface between the conductor and the substrate is substantially devoid of silicide.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
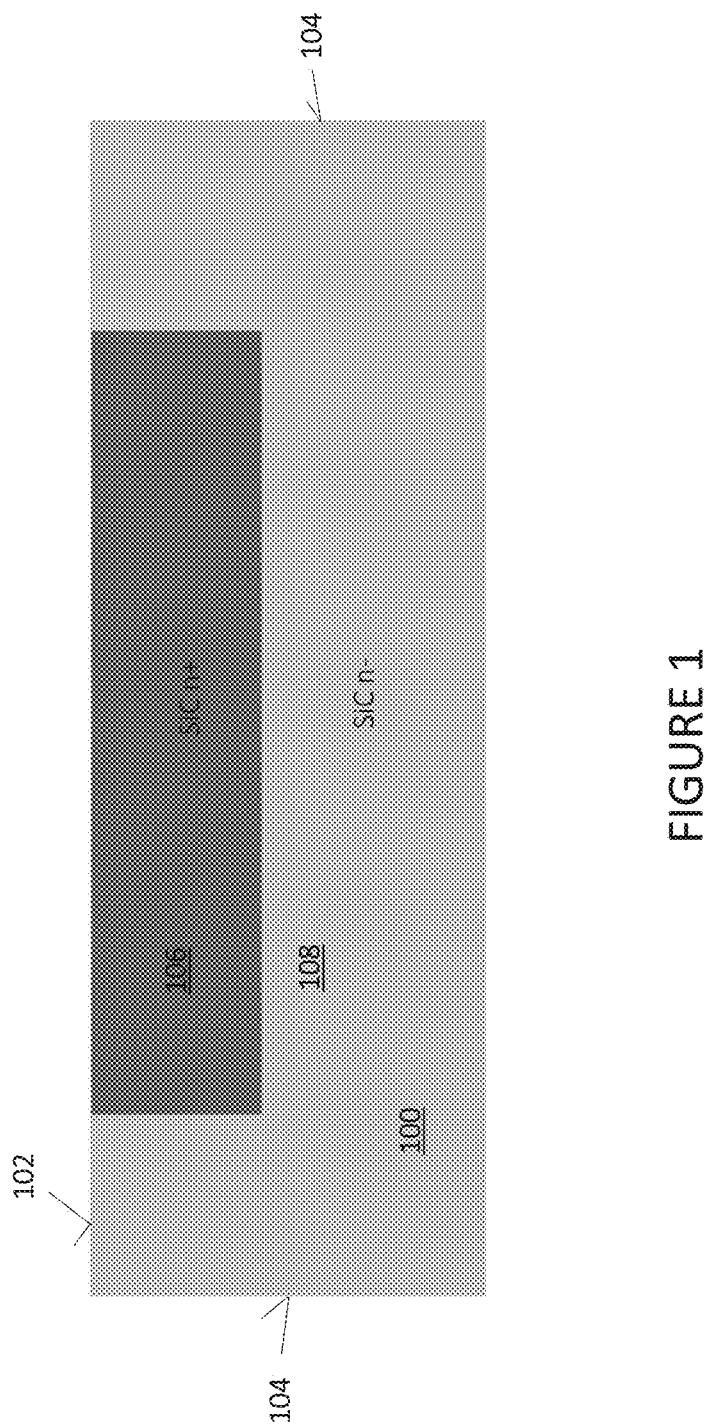
FIG. 1 illustrates a silicon-carbide substrate having a highly doped silicon-carbide contact region, according to an embodiment.

According to embodiments described herein, a silicon-carbide substrate is provided. The silicon-carbide substrate has a highly doped (e.g., N+) contact region that extends to a main surface of the substrate. The highly doped contact region may be part of a device region (source, drain, emitter, collector, etc.) for a semiconductor device (e.g., transistor, diode, etc.) formed within the substrate and to which electrical connection is required. A carbon-based contact region that directly contacts the highly doped contact region is formed. A variety of different techniques can be used to form the carbon-based contact region. For instance, the carbon-based contact region can be formed by depositing a layer of carbon on the substrate, Additionally, or in the alternative, the carbon-based contact region can be formed by implanting carbon ions into the main surface of the substrate. Additionally, or in the alternative, the carbon-based contact region can be formed by selectively removing silicon atoms from the highly doped silicon-carbide contact region near the main surface of the substrate. Subsequently, a conductor (e.g., Au, Al, Ti and alloys thereof) is formed on the carbon-based contact region.

Advantageously, the processes described herein allow for the formation of a carbon-based, silicide free contact structure. Conventionally, forming contact structures for a silicon-carbide based device requires a high temperature silicidization technique in which a silicidizing material (e.g., nickel) is deposited on the SiC substrate and subsequently annealed (e.g., at a temperature of between 900° C. and 1100° C.) so as to induce silicidization at the metal-semiconductor interface. The silicidization process causes a thin layer of carbon to form at the semiconductor interface in additional to the metal-silicide. The thin layer of carbon produces an ohmic contact structure as it reduces the Schottky barrier height at the metal-semiconductor interface. However, the silicidized metal is an unwanted byproduct of this process, as it does not contribute to ohmic current transfer and in fact may pose problems in further power metallization processing. For instance, the silicidized metal may cause delamination between the substrate and the power metallization layer. Moreover, the high thermal budget required for the silicidization process can detrimentally impact the properties of the device. The present techniques include a method step of intentionally forming a carbon layer on the substrate before the conductor is formed. This eliminates the need for silicidization and thus the need for high temperature processing. Thus, the contact structure is free from metal silicide. Advantageously, metals other than nickel (e.g., aluminum (Al), copper (Cu) and titanium (Ti) and alloys thereof) can be used to contact the silicon-carbide substrate. One advantage of these materials is that they are commonly used in Silicon semiconductor processes and are thus highly developed and relatively inexpensive to implement and do not present cross contamination risk.

Referring to FIG. 1, a substrate 100 is depicted. The substrate 100 may be formed from silicon-carbide (SiC), and in particular may be formed from a 4H—SiC crystalline silicon-carbide material. This can be provided from a bulk semiconductor or alternatively can be provided by an epitaxially grown layer. The substrate 100 has a main surface 102 that extends between lateral edge sides 104. According to an embodiment, the main surface 102 extends along a single plane. That is, the main surface 102 forms a plane in a single direction (e.g., a direction that is perpendicular to the lateral edge sides 104) and does not deviate from this plane.

A contact region 106 is formed in the substrate 100. The contact region 106 extends to the main surface 102 of the substrate 100. That is, one side of the contact region 106 is coextensive with the main surface 102 of the substrate 100 and the contact region 106 extends downward from the main surface 102 into the substrate 100. The contact region 106 has a higher doping concentration than a subjacent region 108 of the substrate 100. For example, the subjacent region 108 of the substrate 100 may have a doping concentration corresponding to an intrinsic doping of the substrate 100 material, e.g., on the order of $10^{13}$ and $10^{17}$ cm$^{-3}$. By contrast, the contact region 106 may have a doping concentration on the order of $10^{17}$ cm and $10^2$ cm$^3$. In the embodiment of FIG. 1, the contact region 106 and the subjacent region 108 are n-type regions. Alternatively, the contact region 106 and the subjacent region 108 can be p-type regions.

The substrate 100 configuration of FIG. 1 can be provided using a number of different techniques. For example, a lightly doped (e.g., N—) bulk SiC substrate 100 can be provided and the contact region 106 can be formed by implanting or diffusing dopants (e.g., n-type dopants) into the main surface 102. Alternatively, a lightly doped (e.g., N—) SiC layer can be epitaxially grown on a base substrate 100 and subsequently doped by implanting or diffusing dopants or by performing doping during epitaxial growth.

Figure 2:
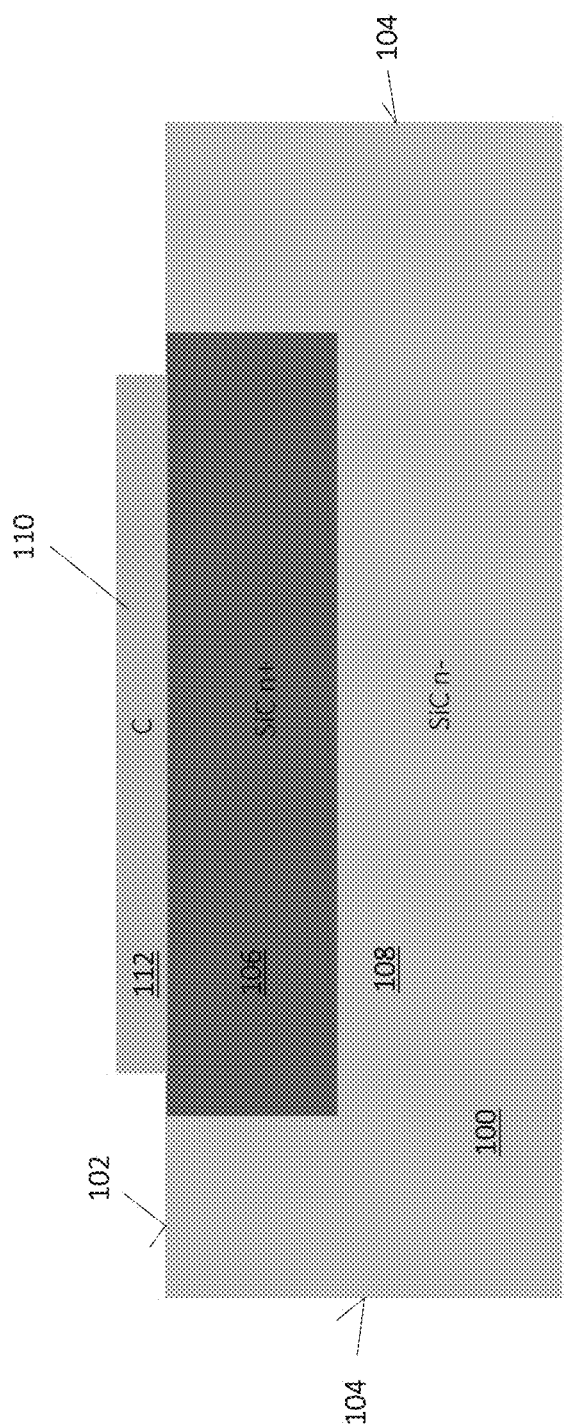
FIG. 2 illustrates forming a carbon-based contact region by depositing a first carbon layer on the main surface of the substrate, according to an embodiment.

Referring to FIG. 2, a carbon-based contact region 110 is formed on the substrate 100. "Carbon-based" refers to the fact that the carbon-based contact region 110 predominantly contains carbon atoms, either in amorphous or crystalline form. The carbon-based contact region 110 extends upward from the main surface 102 and directly contacts the highly doped silicon-carbide contact region 106 at the main surface 102.

According to an embodiment, the carbon-based contact region 110 is formed by depositing a first carbon layer 112 on the main surface 102. The first carbon layer 112 is disposed on the main surface 102 of the substrate 100 and extends away from the main surface 102 in an opposite direction as the contact region 106. The deposition technique used to form the first carbon layer 112 may include chemical vapor deposition (CVD) and plasma-enhanced chemical vapor deposition (PECVD), for example. The PECVD process may be performed formed at 400° C. at a pressure of 8 Tarr with a $CH_4$ He mixture at 500 W for 60 seconds.

The first carbon layer 112 is a three dimensional layer of carbon atoms. The first carbon layer 112 may be a layer of graphite or alternatively may be a layer of amorphous carbon (i.e., carbon that is not in crystal form). According to an embodiment, the first carbon layer 112 is initially deposited as layer of amorphous carbon. Optionally, a graphitizing process is carried out after depositing the amorphous carbon layer so as to transform the amorphous carbon into graphite form. The graphitizing may be achieved by a thermal anneal of between 700° C. and 900° C. for a duration of two minutes or less. The thermal budget for graphitizing can be substantially less than a thermal budget for silicidization (e.g., a temperature of between 900° C. and 1110° C. for a duration of 2-5 minutes, in the case of nickel and silicon-carbide). Alternatively, the first carbon layer 112 can be initially deposited as a graphite layer (e.g., sp$^2$ hybridized graphite) such that no further anneal process is necessary.

Figure 3:
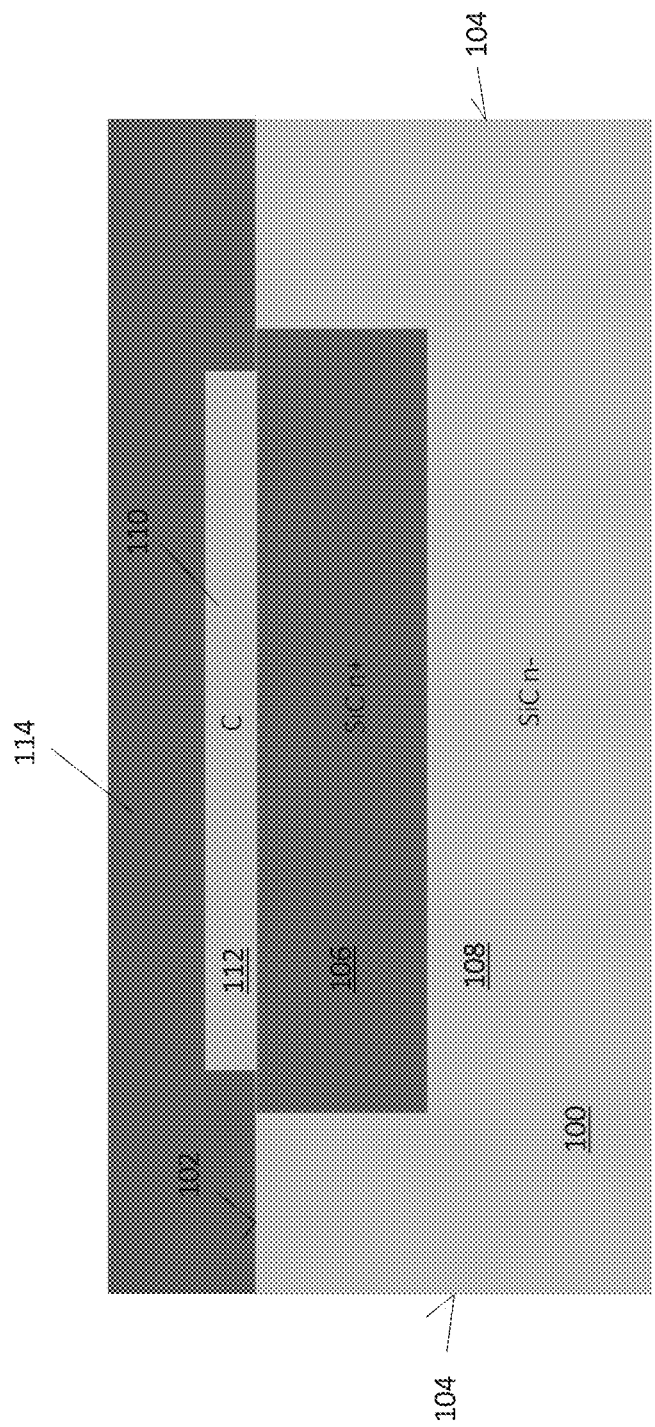
FIG. 3 illustrates a contact structure including a first carbon layer on the main surface of the substrate, according to an embodiment.

Referring to FIG. 3, a conductor 114 is formed on the substrate 100. The conductor 114 is formed over the carbon-based contact region 110 such that the carbon-based contact region 110 is interposed between the conductor 114 and the highly doped silicon-carbide contact region 106. That is, the conductor 114 is disposed above the carbon-based contact region 110 and the highly doped silicon-carbide contact region 106 is disposed below the carbon-based contact region 106. The carbon-based contact region 110 reduces the Schottky barrier at the semiconductor-conductor interface, which enables current flow from the highly doped silicon-carbide contact region 106 to the conductor 114 and vice-versa via the tunneling effect. Accordingly, the contract structure depicted in FIG. 3 exhibits ohmic transfer characteristics.

Advantageously, the conductor 114 is not limited to those materials that are ideally suited for silicidization with silicon-carbide (e.g., nickel) because the carbon-based contact region 110 is independently formed without using silicidization. For example, the conductor 114 can be any metal or alloy including aluminum (Al), copper (Cu) and titanium (Ti). Alternatively, the conductor 114 can be nickel if desired. In that case, the time and temperature of the nickel deposition process can be controlled so as to prevent a nickel alloy from forming in the substrate 100 near the interface with the conductor 114. Thus, silicidization and a corresponding metal silicide in the substrate 100 can be avoided. Moreover, the conductor 114 is not limited to metals. According to another embodiment, the conductor 114 is a highly doped semiconductor (e.g., polysilicon).

The conductor 114 can be can be a via structure that is used to electrically connect a device region (e.g., source, drain, emitter, collector) etc. of an SiC device to a first level metal layer. Alternatively, the conductor 114 can be part of the first level metal layer itself. The conductor 114 can be formed by a deposition technique (e.g., metal organic chemical vapor deposition (MOCVD), sputtering, etc.). The thermal budget for forming the conductor can be maintained below a level that induces metal silicidization in the highly doped silicon-carbide contact region 106.

Figure 4:
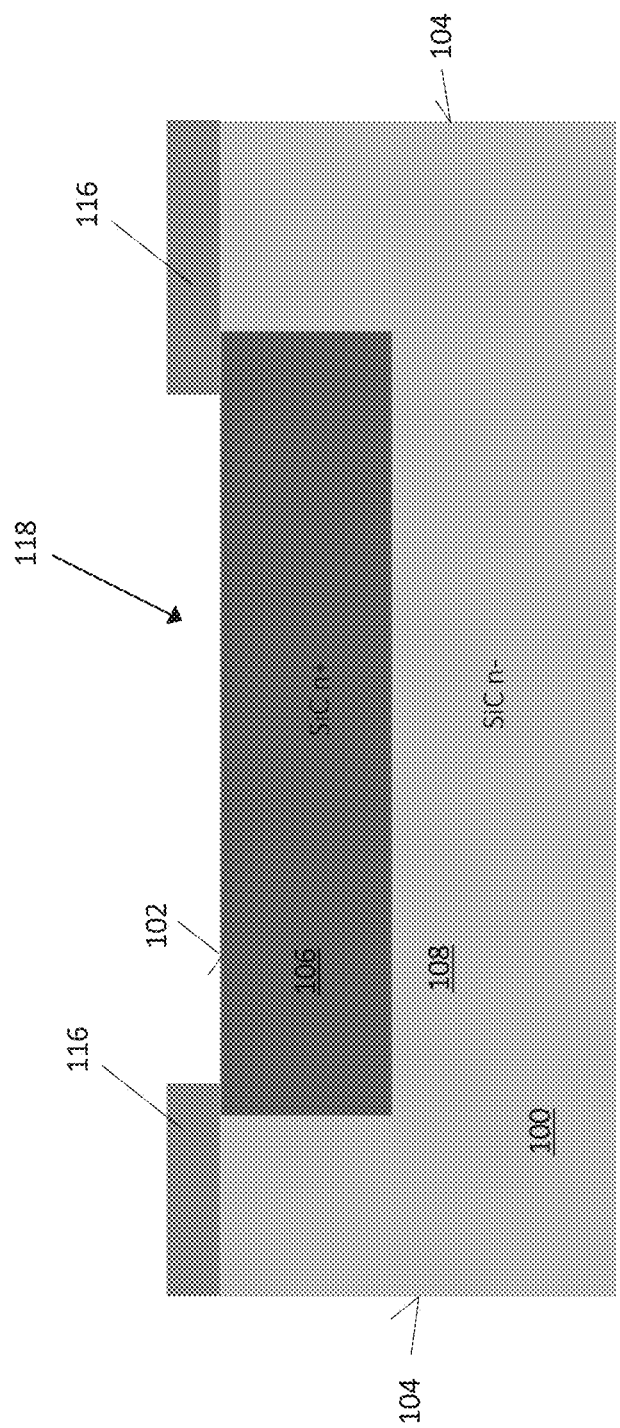
FIG. 4 illustrates forming a mask on the silicon-carbide substrate of FIG. 1, according to an embodiment.
Figure 5:
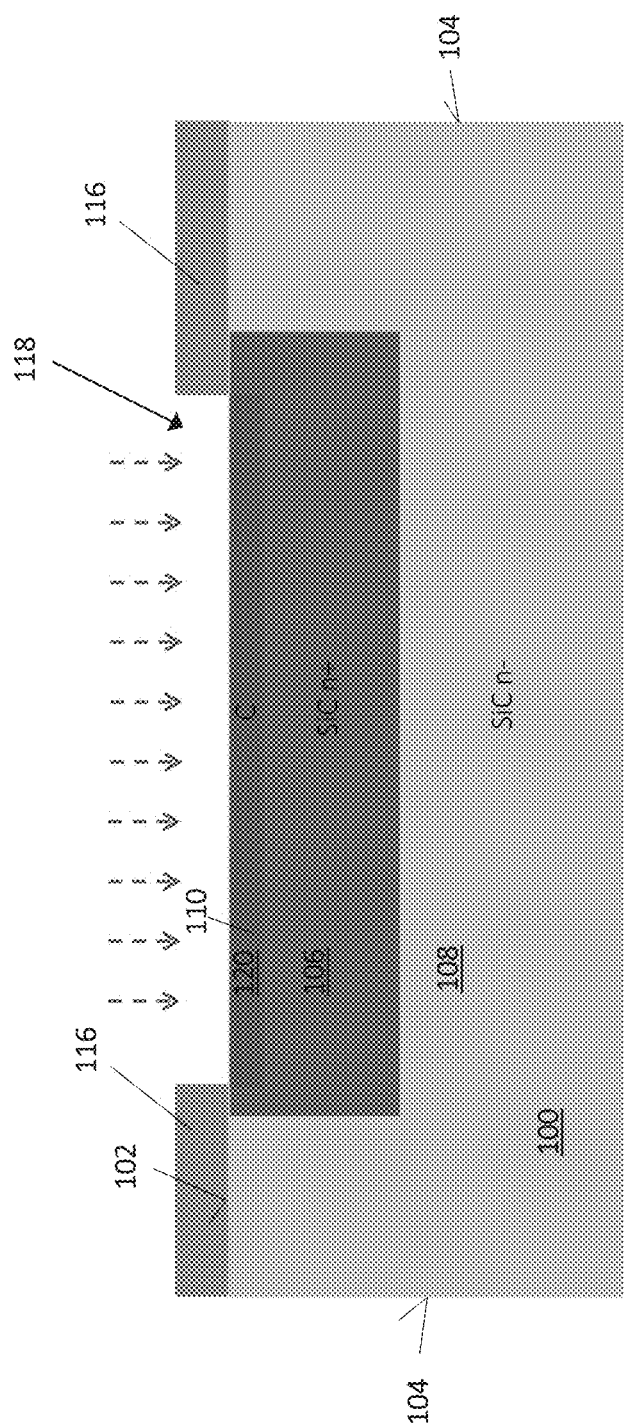
FIG. 5 illustrates forming a carbon-based contact region by implanting carbon ions into the main surface of the substrate thereby forming a carbon-rich layer, according to an embodiment.
Figure 6:
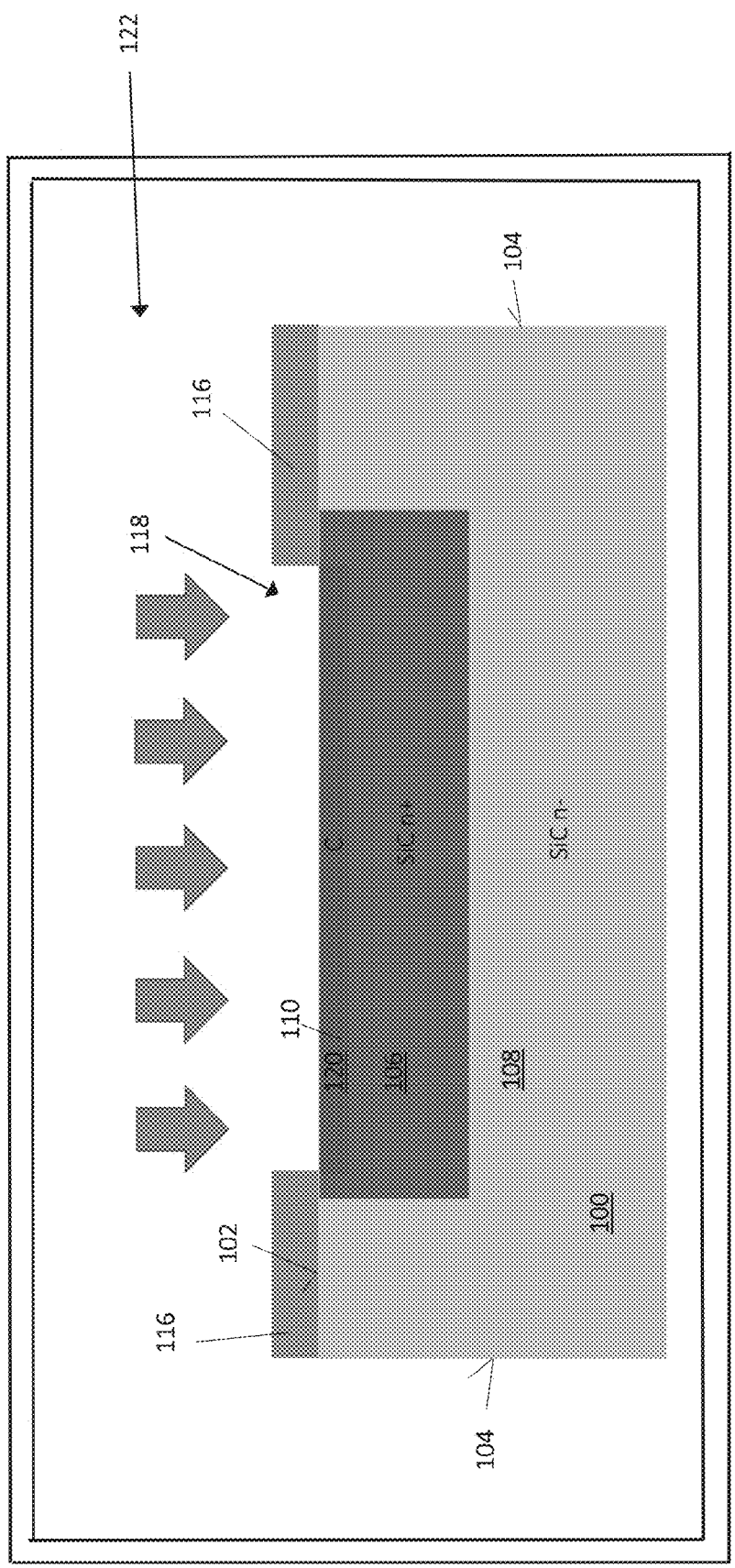
FIG. 6 illustrates forming a carbon-based contact region by treating the main surface of the substrate thereby forming a carbon-rich layer, according to an embodiment.

Referring to FIGS. 4-6, a method of forming the carbon-based contact region 110 is depicted, according to another embodiment. In this embodiment, the carbon-based contact region 110 is formed as a carbon-rich layer 120 that is disposed within the highly doped silicon-carbide contact region 106. That is, instead of being disposed above the main surface 102 as is the case for the carbon-based contact region 110 depicted in FIG. 2, in this embodiment, the carbon-based contact region 110 is formed below the main surface 102 and extends into the substrate 100 in the same direction as the highly doped silicon-carbide contact region 106.

As shown in FIG. 4, a substrate 100 as described with reference to FIG. 1 is provided. A protective mask 116 is formed on the substrate 100 and is patterned such that an opening 118 in the mask 116 exposes a selected portion of the highly doped silicon-carbide contact region 106. The protective mask 116 may be formed from a photoresist material. According to another embodiment, the protective mask 116 is formed from an oxide layer that is patterned using another layer of photoresist (not shown). Other exemplary materials for the protective mask 116 include silicon nitride, carbon and metals such as aluminum (Al), copper (Cu) and titanium (Ti).

Referring to FIG. 5, a carbon-based contact region 110 that includes a carbon-rich layer 120 that is disposed within the highly doped silicon-carbide contact region 106 is formed, according to one embodiment. The carbon-rich layer 120 is formed by implanting carbon ions into the main surface 102 of the substrate 100. The carbon ions can be implanted using any of a variety of well-known ion implantation techniques. The mask 116 is resistant to the carbon ions such that the carbon ions only penetrate the main surface 102 in the region of the substrate 100 that is exposed by the openings 118 in the mask 116.

Referring to FIG. 6, a carbon-based contact region 110 that includes a carbon-rich layer 120 that is disposed within the highly doped silicon-carbide contact region 106 is formed, according to another embodiment. The carbon-rich layer 120 is formed by treating the main surface 102 of the substrate 100. The mask 116 is resistant to the treatment such that the treatment is only applied in the region of the substrate 100 that is exposed by the openings 118 in the mask 116. The treatment may include an etching process. According to this technique, the treatment selectively removes silicon atoms from the doped silicon-carbide contact region 106 thereby leaving the carbon-rich layer 120 in the substrate 100. In general, the treatment process can be any etching process, including wet or dry etching, in which silicon is selectively removed from silicon-carbide. According to an embodiment, the treatment is a fluorine based treatment in which fluorine free-radicals are generated from a remote plasma source (e.g., $NF_3$+argon). The fluorine free-radicals damage the crystalline structure of the substrate 100 near the main surface 102 such that the silicon atoms are freed from the silicon-carbide crystals in the substrate 100 and bond to the fluorine free radicals. The resultant SiF is removed from the treatment chamber 122.

The methods of forming the carbon-rich layer 120 described with reference to FIGS. 5 and 6 can be combined with one another. That is, the ion implantation technique of FIG. 5 can be performed and the selective treatment technique of FIG. 6 can be subsequently performed, or vice-versa.

Figure 7:
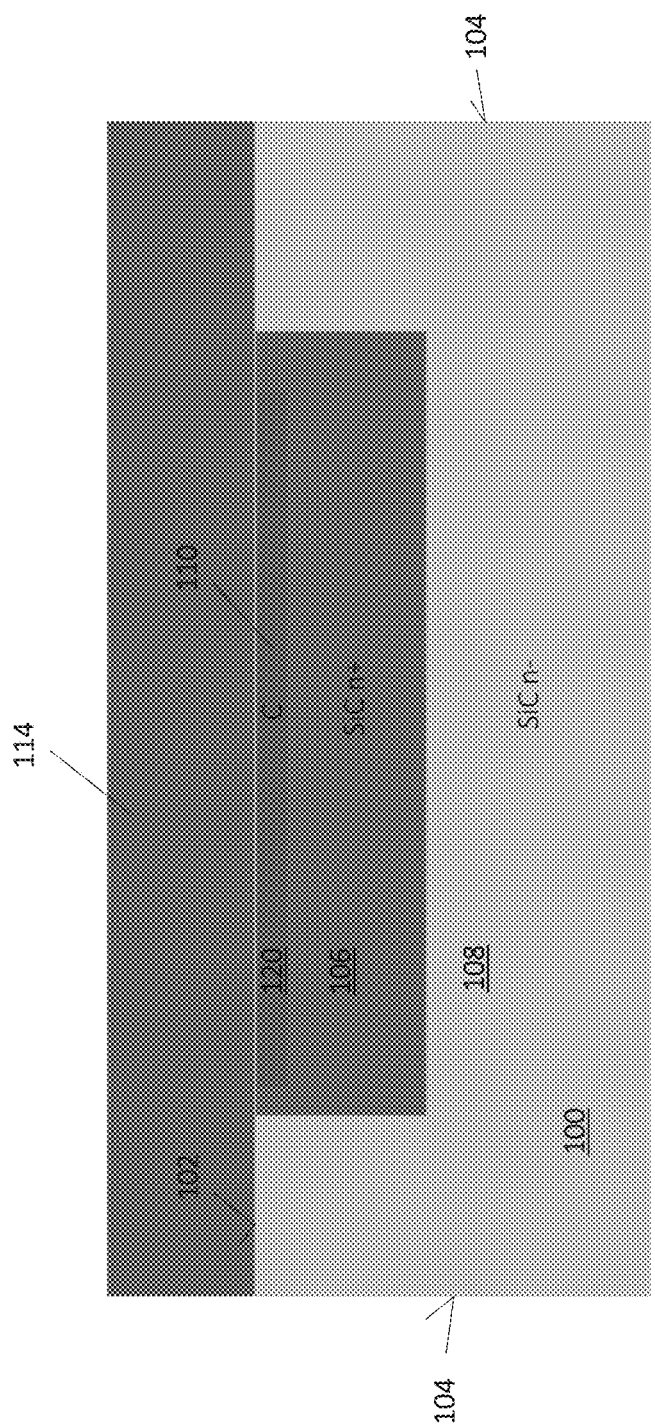
FIG. 7 illustrates a contact structure including a carbon-rich layer that is disposed below the main surface of the substrate, according to an embodiment.

Referring to FIG. 7, a conductor 114 is formed on the carbon-rich layer 120. The conductor 114 may be formed as described with reference to FIG. 3. For example, the conductor 114 can be formed from any metal or alloy including aluminum (Al), copper (Cu) and titanium (Ti), and can also be formed from nickel (Ni). The carbon-rich layer 120 provides the carbon-based contact region 110 that reduces the Schottky barrier height at the semiconductor interface and therefore produces ohmic transfer characteristics in the manner previously described.

Figure 8:
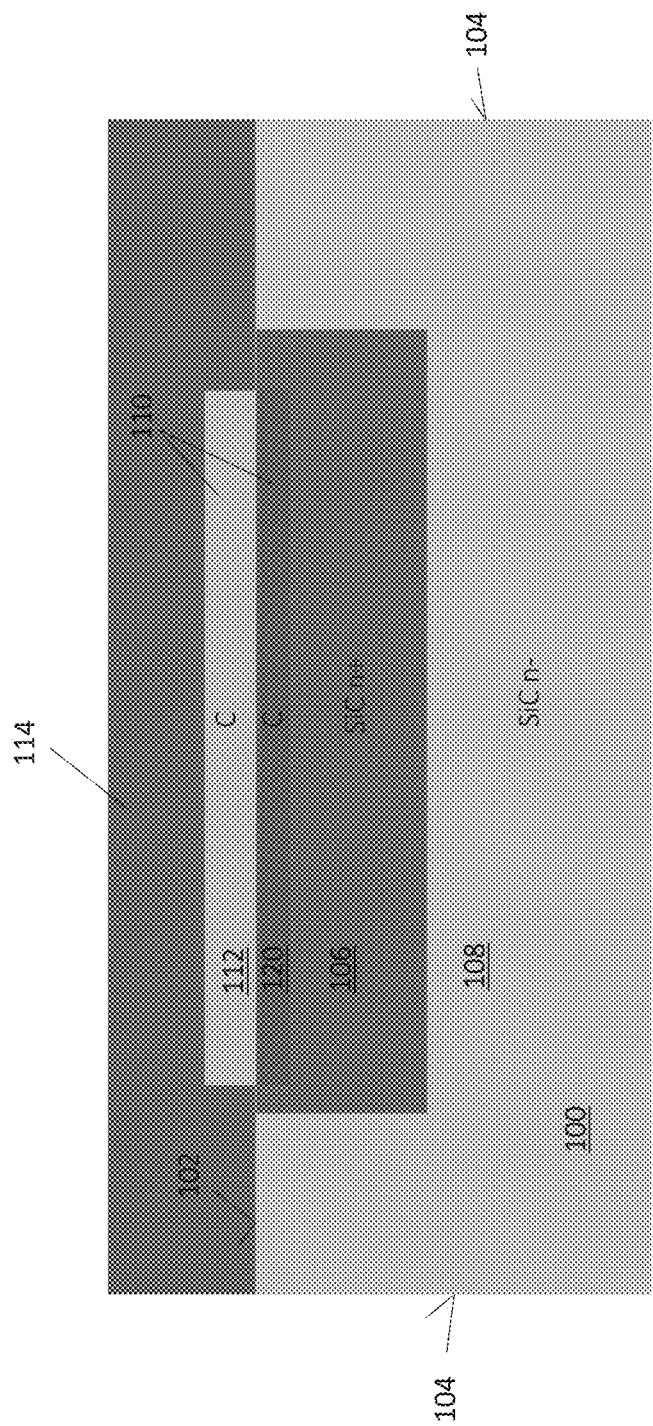
FIG. 8 illustrates a contact structure including a first carbon layer that is disposed above the main surface of the substrate and a second carbon-rich layer that is disposed below the main surface of the substrate, according to an embodiment.

Referring to FIG. 8, a contact structure is depicted, according to another embodiment. In this embodiment, the carbon-based contact region 110 includes both the first carbon layer 112 that is deposited on the main surface 102, as described with reference to FIG. 2, as well as the carbon-rich layer 120 that is formed below the main surface 102, as described with reference to FIGS. 5 and 6. The carbon-based contact region 110 of FIG. 8 is formed by combining the method described with reference to FIGS. 1-3 and the methods described with reference to FIGS. 4-6. More particularly, the carbon-rich layer 120 can be formed according to either one or both of the techniques described with reference to FIGS. 5 and 6. Subsequently, the first carbon layer 112 can be deposited on a portion of the main surface 102 to which the carbon-rich layer 120 extends to in the manner described with reference to FIG. 2. As a result, the carbon-based contact region 110 forms a continuous carbon region that is disposed above and below the main surface 102. The conductor can include any metal or metal alloy including aluminum (Al), copper (Cu) and titanium (Ti), as well as nickel (Ni).

The inventors have found that the combination of each of the techniques described herein has a cumulative effect with respect to the beneficial electrical properties of the contact structure. That is, the I-V characteristics of the contact structure see a favorable improvement in conductivity and knee voltage (Schottky barrier) when two or more of the techniques described herein are combined. For example, a contact structure that includes both the deposited first carbon layer 112 and the second carbon-rich layer 120 (e.g., as shown in FIG. 8) sees a beneficial improvement in conductivity and knee voltage (Schottky barrier) in comparison to a contact structure with only one of these features. Furthermore, graphitizing the first carbon layer 112 produces a beneficial improvement in conductivity and knee voltage (Schottky barrier) in comparison to a contact structure with an amorphous first carbon layer 112.

The figures illustrate relative doping concentrations by indicating "−" or "+" next to the doping type "n" or "p". For example, "$n^-$" means a doping concentration that is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

In the context of the present disclosure, the term "ohmic" refers to a contact having an approximately constant ratio of voltage/current that does not depend from the polarity of the applied voltage. The term "ohmic contact" also encompasses contacts having a voltage/current characteristic which is not strictly linear but includes minor non-linearities.

With the above range of variations and applications in mind, it should be understood that the present invention is not limited by the foregoing description, nor it limited by the accompanying drawings. Instead, the present invention is limited only by the following claims and their legal equivalents.

What is claimed is:

1. A method of forming a contact structure for a semiconductor device, comprising:
   providing a silicon-carbide substrate having a highly doped silicon-carbide contact region formed in the substrate and extending to a main surface of the substrate;
   forming a carbon-based contact region in direct contact with the highly doped silicon-carbide contact region and which extends to the main surface;
   forming a conductor on the carbon-based contact region such that the carbon-based contact region is interposed between the conductor and the highly doped silicon-carbide contact region and such that the conductor is in ohmic contact with the carbon-based contact region,
   wherein a thermal budget for forming the carbon-based contact region is maintained below a level that induces silicidization of the highly doped silicon-carbide contact region, and
   wherein forming the carbon-based contact region comprises depositing a carbon layer directly on the main surface of the substrate, and wherein forming the conductor comprises forming the conductor directly on the carbon layer.

2. The method of claim 1, wherein forming the carbon contact region comprises depositing carbon on the main surface of the substrate prior to forming the conductor so as to form a first carbon layer that is disposed on the highly doped silicon-carbide contact region above the main surface.

3. The method of claim 2, wherein forming the carbon contact region comprises depositing an amorphous carbon layer on the first surface and graphitizing the first carbon layer prior to forming the conductor.

4. The method of claim 2, wherein the main surface extends along a single plane, and wherein the first carbon layer is coplanar with the main surface.

5. The method of claim 2, wherein forming the carbon contact region further comprises forming a second carbon-rich layer in the substrate that is disposed within the highly doped silicon-carbide contact region below the main surface and adjoins the first carbon layer at the main surface.

6. The method of claim 5, wherein forming the second carbon-rich layer comprises at least one of:
   implanting carbon ions into the main surface of the substrate; and
   treating the main surface of the substrate so as to remove silicon atoms from the highly doped silicon-carbide contact region.

7. The method of claim 1, wherein forming the carbon contact region comprises, prior to forming the conductor, forming a carbon-rich layer that is disposed within the highly doped silicon-carbide contact region below the main surface.

8. The method of claim 7, wherein forming the carbon-rich layer comprises implanting carbon ions into the main surface of the substrate.

9. The method of claim 7, wherein forming the carbon-rich layer comprises treating the main surface of the substrate so as to remove silicon atoms from the doped silicon-carbide contact region.

10. The method of claim 9, wherein treating the main surface of the substrate comprises applying a fluorine treatment to the main surface using a remote plasma source.

11. The method of claim 1, wherein the conductor comprises a metal or metal alloy including at least one of: Aluminum (Al), Copper (Cu) and Titanium (Ti).

12. A method of forming a contact structure for a semiconductor device, comprising:
   providing a silicon-carbide substrate having a highly doped silicon-carbide contact region formed in the substrate and extending to a main surface of the substrate;
   forming a carbon-based contact region in direct contact with the highly doped silicon-carbide contact region and which extends to the main surface;
   forming a conductor on the carbon-based contact region such that the carbon-based contact region is interposed between the conductor and the highly doped silicon-carbide contact region, and such that the conductor is in ohmic contact with the carbon-based contact region,
   wherein the carbon-based contact region is formed before the conductor, and
   wherein the main surface extends along a single plane, and
   wherein forming the carbon-based contact region comprises depositing a carbon layer directly on the main surface of the substrate and forming the conductor comprises forming the conductor directly on the carbon layer, or wherein forming the carbon-based contact region comprises implanting carbon ions directly into the main surface or selectively removing silicon atoms from the silicon-carbide substrate and forming the conductor comprises forming the conductor directly on the main surface.

13. The method of claim 12, wherein forming the carbon-based contact region comprises depositing carbon on the main surface of the substrate prior to forming the conductor so as to form a first carbon layer that is disposed on the highly doped silicon-carbide contact region above the main surface.

14. The method of claim 12, wherein forming the carbon-based contact region comprises implanting carbon ions into the main surface of the substrate so as to form a carbon rich layer that is disposed within the highly doped silicon-carbide contact region below the main surface.

15. The method of claim 12, wherein forming the carbon contact region comprises treating the main surface of the substrate so as to remove silicon atoms from the doped silicon-carbide contact region thereby forming a carbon rich layer that is disposed within the highly doped silicon-carbide contact region below the main surface.

16. The method of claim 12, wherein the conductor comprises a metal or metal alloy including at least one of: Aluminum (Al), Copper (Cu) and Titanium (Ti).

17. The method of claim 12, wherein the conductor comprises nickel and wherein a thermal budget for forming the carbon-based contact region and for forming the conductor is maintained below a level that induces silicidization of the highly doped silicon-carbide contact region.

18. A method of forming a contact structure for a semiconductor device, comprising:
 providing a silicon-carbide substrate having a highly doped silicon-carbide contact region formed in the substrate and extending to a main surface of the substrate;
 forming a carbon-based contact region in direct contact with the highly doped silicon-carbide contact region and which extends to the main surface;
 forming a conductor on the carbon-based contact region such that the carbon-based contact region is interposed between the conductor and the highly doped silicon-carbide contact region and such that the conductor is in ohmic contact with the carbon-based contact region,
 wherein a thermal budget for forming the carbon-based contact region is maintained below a level that induces silicidization of the highly doped silicon-carbide contact region,
 wherein forming the carbon contact region comprises implanting carbon ions directly into the main surface or selectively removing silicon atoms from the silicon-carbide substrate, and wherein forming the conductor comprises forming the conductor directly on the main surface.

* * * * *